(12) United States Patent
Kang

(10) Patent No.: US 7,957,186 B2
(45) Date of Patent: Jun. 7, 2011

(54) NON-VOLATILE MEMORY SYSTEM AND DATA READ METHOD OF NON-VOLATILE MEMORY SYSTEM

(75) Inventor: Dong-ku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 119 days.

(21) Appl. No.: 12/018,300

(22) Filed: Jan. 23, 2008

(65) Prior Publication Data

US 2008/0175058 A1 Jul. 24, 2008

(30) Foreign Application Priority Data

Jan. 23, 2007 (KR) ........................ 10-2007-0007247

(51) Int. Cl.
*G11C 11/34* (2006.01)
(52) U.S. Cl. .......... 365/185.03; 365/185.11; 365/185.33
(58) Field of Classification Search ............. 365/185.03, 365/185.11, 185.33, 238.5, 189.05; 711/103
See application file for complete search history.

(56) References Cited

U.S. PATENT DOCUMENTS

| | | | | |
|---|---|---|---|---|
| 4,882,710 A * | 11/1989 | Hashimoto et al. | ...... | 365/189.05 |
| 7,333,364 B2 * | 2/2008 | Yu et al. | .................. | 365/185.11 |
| 7,388,778 B2 * | 6/2008 | Hwang | ..................... | 365/185.03 |
| 7,433,246 B2 * | 10/2008 | Lee | ............................. | 365/238.5 |
| 7,466,592 B2 * | 12/2008 | Mitani et al. | ............. | 365/185.03 |
| 7,529,129 B2 * | 5/2009 | Roohparvar | ............. | 365/185.03 |
| 7,548,457 B2 * | 6/2009 | Kang et al. | ............... | 365/185.03 |
| 7,768,828 B2 * | 8/2010 | Lee | ........................... | 365/185.03 |
| 7,773,418 B2 * | 8/2010 | Aritome | ................... | 365/185.03 |
| 7,808,822 B2 * | 10/2010 | Han | ......................... | 365/185.03 |
| 7,843,733 B2 * | 11/2010 | Kim et al. | ................. | 365/185.11 |

FOREIGN PATENT DOCUMENTS

| | | |
|---|---|---|
| JP | 2003-022687 | 1/2003 |
| KR | 100332950 B1 | 4/2002 |
| KR | 1020050096445 A | 10/2005 |
| KR | 1020060030172 A | 4/2006 |

OTHER PUBLICATIONS

U.S. Appl. No. 2008/0215801 A1 (U.S. Appl. No. 11/992,546), filed Sep. 2008, Tan et al.*

* cited by examiner

*Primary Examiner* — Trong Phan
(74) *Attorney, Agent, or Firm* — Volentine & Whitt, PLLC

(57) ABSTRACT

In one aspect, a non-volatile memory system includes a plurality of memory cell arrays having different read stand-by times. For example, the non-volatile memory system may include a single-level cell (SLC) array composed of a plurality of SLCs, and a multi-level cell (MLC) array composed of a plurality of MLCs. In this case, the SLC array and the MLC array receive a read instruction at the same time and prepare to read data at the same time. However, the SLC array begins to read the data prior to the MLC array, and the MLC array begins to read the data once the SLC array has completely read the data.

7 Claims, 3 Drawing Sheets

NON-VOLATILE MEMORY SYSTEM AND DATA READ METHOD OF NON-VOLATILE MEMORY SYSTEM

CROSS-REFERENCE TO RELATED PATENT APPLICATION

A claim of priority is made to Korean Patent Application No. 10-2007-0007247, filed Jan. 23, 2007, in the Korean Intellectual Property Office, the disclosure of which is incorporated herein in its entirety by reference.

BACKGROUND OF THE INVENTION

1. Field of the Invention

The present invention relates to a non-volatile memory system, and more particularly, to a non-volatile memory system which may include a plurality of memory cell arrays having different read stand-by times, and to method of reading data in a non-volatile memory system.

2. Description of the Related Art

Non-volatile memory devices, such as flash memory, retain data in the absence of supplied power. Each memory cell of flash memory is composed of a cell transistor. The cell transistor includes a control gate, a floating gate, a source, and a drain, and is programmed or erased by utilizing a mechanism known as Fowler-Nordheim (F-N) tunneling.

An erasing operation of the cell transistor is performed by applying a low voltage (e.g., ground) to the control gate and a relatively high voltage (higher than a source voltage) to a semiconductor substrate or a bulk. Under this erase bias condition, a strong electric field is formed between the floating gate and the bulk due to the large voltage difference therebetween, and thus F-N tunneling is induced in which electrons of the floating gate are emitted to the bulk. As a result, a threshold voltage of the erased cell transistor is moved in a negative direction.

A programming operation of the cell transistor is performed by applying a high voltage (higher than a source voltage) to the control gate and a low voltage (e.g., ground) to the drain and the bulk. Under this programming bias condition, F-N tunneling is induced such that electrons are injected into the floating gate of the cell transistor. As a result, the threshold voltage of the programmed cell transistor is moved in a positive direction.

FIG. 1 is a diagram for describing the structure and threshold voltage distribution of a single-bit memory cell included in a non-volatile memory device.

Referring to FIG. 1, a memory cell includes a control gate CG and a floating gate FG. As shown in the right side of FIG. 1, a programming state PROGRAM is characterized by electrons filling the floating gate FG of the memory cell. As a result, the threshold voltage (Vth) distribution is greater than 0V. In contrast, referring to the left side of FIG. 1, an erasing state ERASE is characterized by an absence of electrons in the floating gate FG. In this state, the threshold voltage distribution is less than 0V. The two different threshold voltage distributions allows for storage of a single bit data (1 or 0) in each cell. In FIG. 1 the Y-axis (NO. OF CELL) denotes a number of cells of each of the ERASE and PROGRAM threshold volta e distributions.

In contrast, multi-level cell (MCL) flash memory is characterized by storing two or more bits per cell. For example, in the case of two-bit cells, the threshold voltage of each cell can fall within one of four different threshold distributions, which respectively denote two-bit data 11, 01, 10, and 00. In this case, 11 is typically designated as an erased state, and 01, 10, and 00 are program states.

FIG. 2 is a diagram for describing the structure and threshold distributions of a multi-level cell included in a non-volatile memory device.

Referring to FIG. 2, each memory cell includes a control gate CG, a floating gate FG, N-doped source and drain N+, and P-doped substrate P+SUBSTRATE. An erased state ($1^{st}$ state) has the lowest threshold distribution and is characterized by an absence of electrons in the floating gate FG. The three program states ($2^{nd}$, $3^{rd}$ and $4^{th}$ states) are characterized by progressively higher numbers of electrons in the floating gate FG, which results in progressively higher threshold voltage distributions.

A non-volatile memory system may conceivably include both single-level cells (SLCs) and multi-level cells (MLCs). However, implementation of such a system is complicated by the fact that different read times are associated with SLC and MLC systems. That is, the time required for an MLC to receive a read instruction and to read data is at least twice as long as the time required for an SLC to receive a read instruction and to read data.

SUMMARY OF THE INVENTION

According to an aspect of the present invention, there is provided a non-volatile memory system including a single-level cell (SLC) array composed of a plurality of SLCs, and a multi-level cell (MLC) array composed of a plurality of MLCs. The SLC array and the MLC array receive a read instruction at the same time and prepare to read data at the same time. The SLC array begins to read the data prior to the MLC array. The MLC array begins to read the data once the SLC array has completely read the data.

According to another aspect of the present invention, there is provided a non-volatile memory system comprising a plurality of memory cell arrays which receive a read instruction at the same time and have respectively different read stand-by times. Each memory cell array comprises a plurality of memory cells, and a memory cell array having a shortest read stand-by time among the plurality of memory cell arrays firstly begins to read data in response to the read instruction.

According to another aspect of the present invention, there is provided a non-volatile memory system including a single-level cell (SLC) array composed of a plurality of SLCs, and a multi-level cell (MLC) array composed of a plurality of MLCs. The SLC array and the MLC array share row addresses.

According to another aspect of the present invention, a non-volatile memory system comprising a plurality of memory cell arrays which receive a read instruction at the same time and have respectively different read stand-by times. Each memory cell comprises a plurality of memory cells, and the memory cell arrays share row addresses.

According to another aspect of the present invention, there is provided a data read method of a non-volatile memory system comprising a single-level cell (SLC) array composed of a plurality of SLCs and a multi-level cell (MLC) array composed of a plurality of MLCs, the data read method including applying a read instruction to the MLC array and the SLC array at the same time, the SLC array and the MLC array preparing to read data at the same time, and the SLC array reading the data.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

Figure 1:
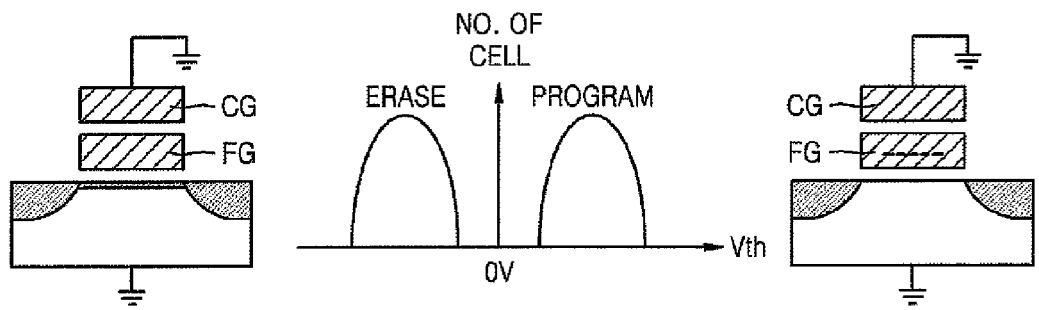
FIG. 1 is a diagram illustrating the structure and threshold voltage distributions of a non-volatile memory cell operating as a single-level cell (SLC)
Figure 2:
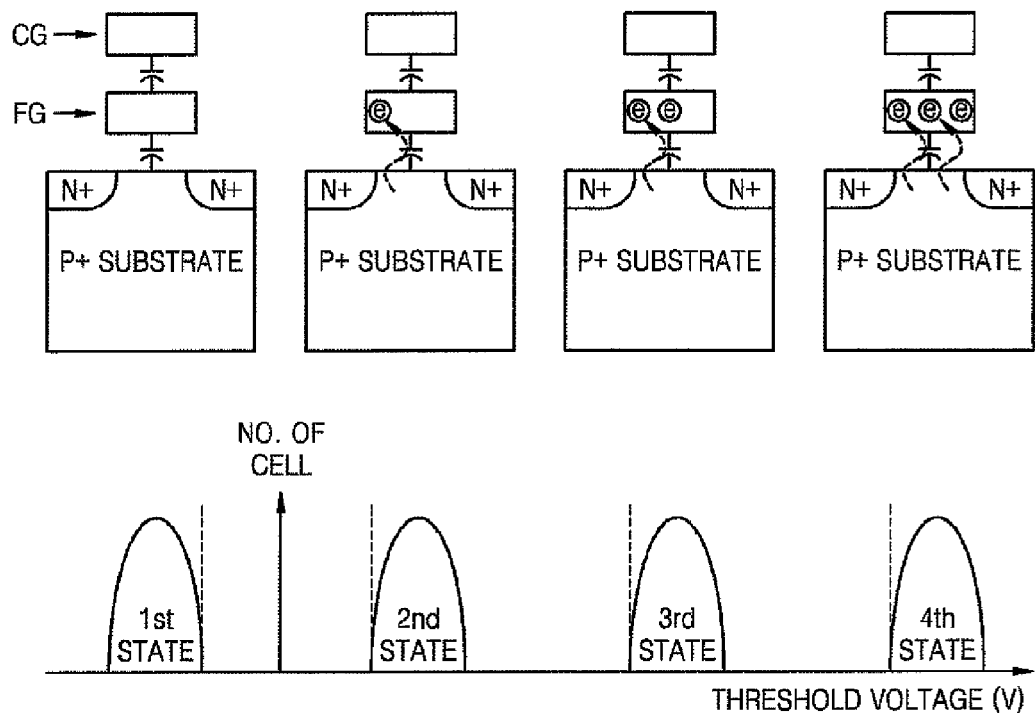
FIG. 2 is a diagram illustrating the structure and threshold voltage distributions of a non-volatile memory cell operating as a multi-level cell (MLC)

The accompanying drawings and the description that follows are presented to facilitate understanding of the present invention, the merits thereof, and objectives which may be accomplished by implementation of the present invention. However, the invention is not limited to the specific examples presented in the drawings and in the described embodiments.

Figure 3:
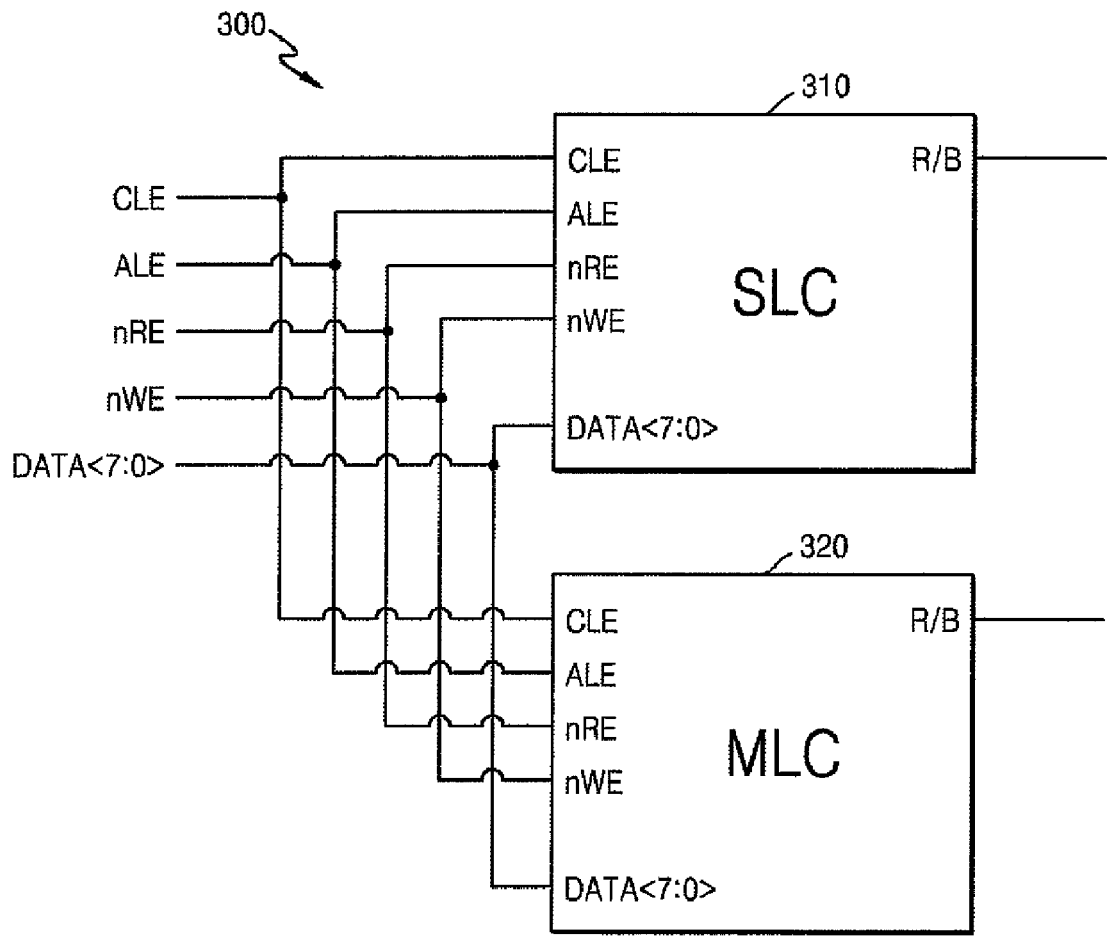
FIG. 3 is a block diagram of a non-volatile memory system according to an embodiment of the present invention.

FIG. 3 is a block diagram of a non-volatile memory system 300 according to an embodiment of the present invention.

Referring to FIG. 3, the non-volatile memory system 300 includes a single-level cell (SLC) array 310 composed of a plurality of SLCs, and a multi-level cell (MLC) array 320 composed of a plurality of MLCs. In FIG. 3, CLE is a clock enable signal, ALE is an address latch enable signal, nRE is a read enable signal, new is a right enable signal, DATA<7:0> is data, and R/B is a control terminal.

In operation, the SLC array 310 and the MLC array 320 receive a read instruction at the same time and prepare to read data at the same time. However, in the example of this embodiment, the SLC array 310 begins to read the data prior to the MLC array 320, and the MLC array 320 begins to read data once the SLC array 310 has completely read the data.

That is, in this embodiment, the SLC array 310 and the MLC array 320 receive the read instruction at the same time and then prepare to read the data, in parallel with each other. Once a read stand-by time of the SLC array 310, which has a shortest read stand-by time among the two arrays, has elapsed, the SLC array 310 begins to read the data. While the SLC array 310 is reading data, a read stand-by time of the MLC array 320, which has a longest read stand-by time, elapses. Then, the MLC array 320 begins to read data once the SLC array 310 has completely read the data. Accordingly, the time taken by all SLCs and MLCs to read data may be reduced.

The SLC array 310 may begin to read data once the read stand-by time of the SLCs has elapsed after the read instruction is received. The MLC array 320 may begin to read data once the read stand-by time of the MLCs has elapsed and the SLC array 310 has completely read the data after the read instruction is received.

The SLC array 310 and the MLC array 320 may receive various other operation signals at the same time. For example, the write enable signal nWE may be received at the same time.

The non-volatile memory system 300 may include a plurality (more than two) of memory cell arrays each having a plurality of memory cells and each having respectively different read stand-by times. The memory cell arrays may receive a read instruction at the same time and the memory cell array having a shortest read stand-by time may firstly begin to read data. The memory cell array having a longest read stand-by time may begin to read the data once the longest read stand-by time has elapsed and the memory cell array having the shortest read stand-by time has completely read the data after the read instruction is received.

Figure 4:
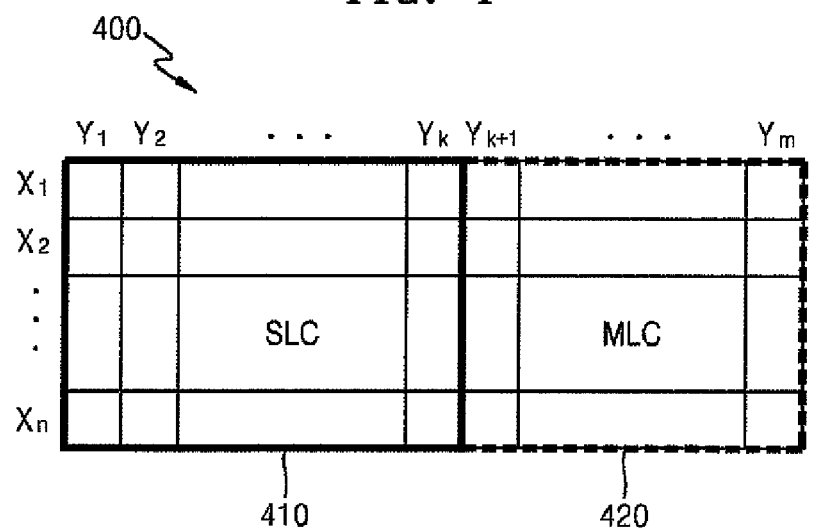
FIG. 4 is a diagram of a non-volatile memory system according to another embodiment of the present invention.

FIG. 4 is a diagram of a non-volatile memory system 400 according to another embodiment of the present invention.

Referring to FIG. 4, the non-volatile memory system 400 includes an SLC array 410 composed of a plurality of SLCs, and an MLC array 420 composed of a plurality of MLCs. The SLC array 410 and the MLC array 420 share a plurality of row addresses X1 through Xn.

The SLC array 410 and the MLC array 420 may have different column addresses from each other. In FIG. 4, the SLC array 410 has column addresses Y1 through Yk and the MLC array 420 has column addresses Yk+1 through Ym.

The column addresses Yk+1 through Ym of the MLC array 420 may be continued from or to the column addresses Y1 through Yk of the SLC array 410. For example, as illustrated in FIG. 4, a start column address Yk+1 of the MLC array 420 may be a subsequent address of a final column address Yk of the SLC array 410. On the other hand, a start column address Y1 of the SLC array 410 may be a subsequent address of a final column address Ym of the MLC array 420.

The non-volatile memory system 400 may read data indicated by the final column address Yk of the SLC array 410 and then may read data indicated by the start column address Yk+1 of the MLC array 420.

A pointer of the non-volatile memory system 400 may point to the final column address Yk of the SLC array 410 and then may point to the start column address Yk+1 of the MLC array 420.

The non-volatile memory system 400 may include a plurality of memory cell arrays. Each memory cell is composed of a plurality of memory cells and the memory cell arrays have respectively different read stand-by times. The memory cell arrays share row addresses. Also, as mentioned above, the memory cell arrays may have different column addresses from each other, and the memory cell arrays may have sequential column addresses.

Figure 5:
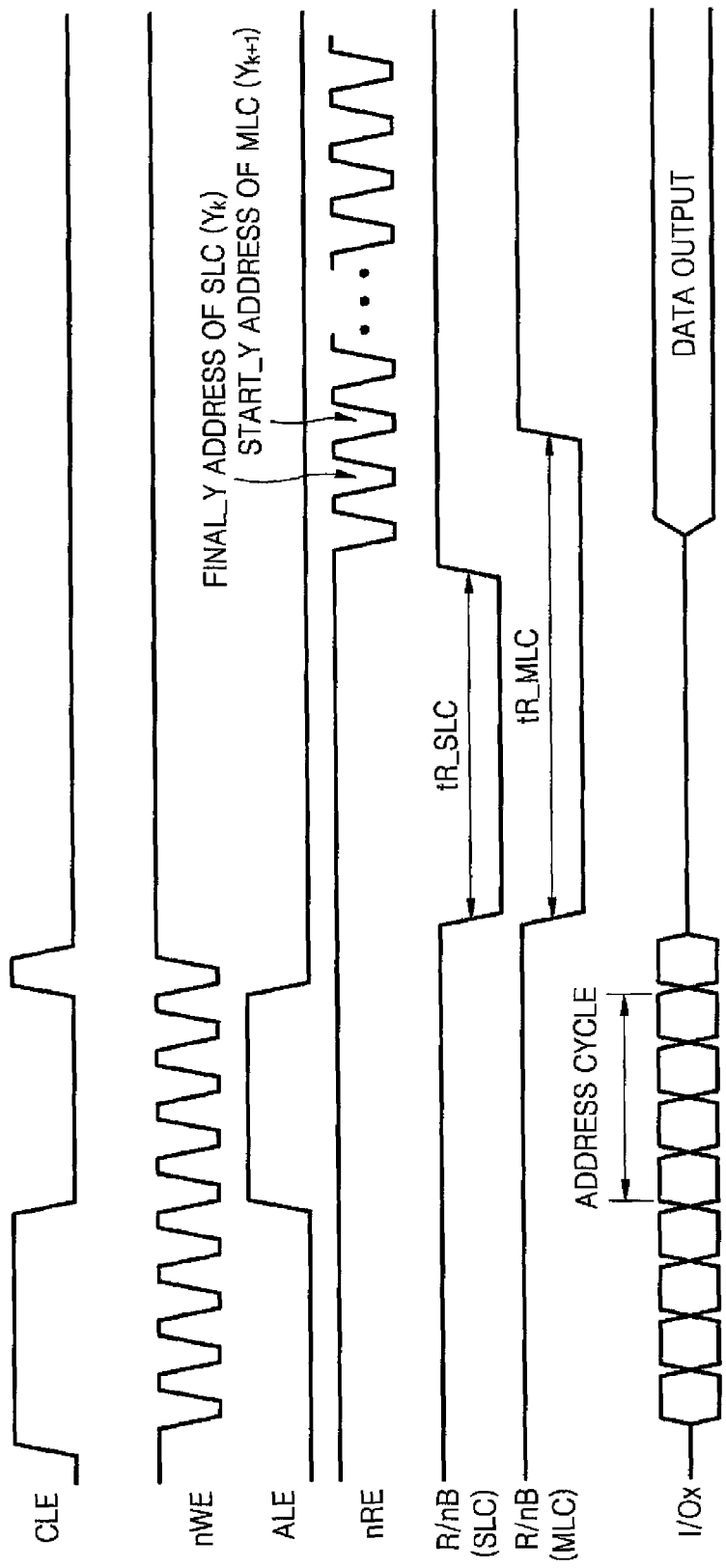
FIG. 5 is a timing diagram for describing the operation of the non-volatile memory system illustrated in FIG. 3 or FIG. 4, according to an embodiment of the present invention.

FIG. 5 is a timing diagram for describing the operation of the non-volatile memory systems 300 and 400 illustrated in FIGS. 3 and 4, according to an embodiment of the present invention.

Referring to FIG. 5, the non-volatile memory systems 300 and 400 receive a read instruction 30h of a reference numeral I/Ox. Then, once a short read stand-by time tR_SLC of the SLC arrays 310 and 410 has passed, the SLC arrays 310 and 410 begin to read data. Then, once a long read stand-by time tR_MLC of the MLC arrays 320 and 420 has passed, the MLC arrays 320 and 420 begin to read the data. For example, referring to nRE of FIG. 5, once data indicated by a final column address Yk (FINAL_Y ADDRESS OF SLC (Yk)) of the SLC arrays 310 and 410 is read, data indicated by a start column address Yk+1 (START_Y ADDRESS OF MLC(Yk+1)) of the MLC arrays 320 and 420 may be read. Meanwhile, a section from which data is output is indicated as 'Data Output' of I/Ox. As is apparent from FIG. 5, Data Output of I/Ox begins once the short read stand-by time tR_SLC of the SLC arrays 310 and 410 has passed.

A data read method according to an embodiment of the present invention is performed by the non-volatile memory systems 300 and 400 including an SLC array composed of a plurality of SLCs and an MLC array composed of a plurality of MLCs. The data read method includes applying a read instruction to the MLC array and the SLC array at the same time; the SLC array and the MLC array preparing to read data, at the same time; and the SLC array reading the data.

The data read method may further include the MLC array reading the data after the SLC array reads the data.

Operations and technical features of the data read method correspond to the operations and technical features of the non-volatile memory systems 300 and 400 illustrated in FIGS. 3 and 4. Thus, those of ordinary skill in the art will understand the operations of the data read method according to the current embodiment. Therefore, detailed descriptions thereof is omitted here.

As described above, according to one or more embodiments of the invention, a plurality of memory cell arrays receive a read instruction and prepare to read data at the same time, and then a memory cell array having a shortest read stand-by time firstly begins to read the data. Thus, the time taken by all SLCs and MLCs to read data may be reduced.

Also, according to one or more embodiments of the present invention, the memory cell arrays share row addresses. Accordingly, a row address may be received at the same time and reading of data may be prepared at the same time. Thus, the time taken by all SLCs and MLCs to read data may further be reduced.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A non-volatile memory system comprising:
   a single-level cell (SLC) array composed of a plurality of SLCs; and
   a multi-level cell (MLC) array composed of a plurality of MLCs,
   wherein the SLC array and the MLC array share a same data bus to output read SLC data and read MLC data from the SLC array and MLC array, respectively,
   wherein the SLC array and the MLC array simultaneously receive a read instruction,
   wherein the SLC array and the MLC array are responsive to the read instruction to simultaneously initiate a read operation in accordance with the read instruction, and
   wherein outputting of the read MLC data from the MLC array on the data bus begins after completion of outputting of the read SLC data from the SLC array on the data bus.

2. The non-volatile memory system of claim 1, wherein the SLC array begins to output the SLC read data once a read stand-by time of the SLC array has elapsed after the read instruction is received, and
   wherein the MLC array begins to output the MLC read data once a read stand-by time of the MLC array has elapsed after the read instruction is received and the SLC array has completely read the data.

3. The non-volatile memory system of claim 2, wherein the read standby time of the SLC array overlaps the read standby time of the MLC array, and
   wherein the read standby time of the SLC array is shorter than the read standby time of the MLC array.

4. The non-volatile memory system of claim 1, wherein the first SLC array includes a first data terminal and the MLC array includes a second data terminal, and
   wherein the first and second data terminals are commonly connected to the data bus.

5. The non-volatile memory system of claim 3, wherein the SLC array includes a first read enable terminal, a first write enable terminal, a first clock enable terminal, and a first address latch enable terminal,
   wherein the MLC array includes a second read enable terminal, a second write enable terminal, a second clock enable terminal, and a second address latch enable terminal, and
   wherein first read enable terminal is coupled to the second read enable terminal, the first write enable terminal is coupled to the second write enable terminal, the first clock enable terminal is couple to the second clock enable terminal, and the first address latch enable terminal is coupled to the second address latch enable terminal.

6. The non-volatile memory system of claim 1, wherein the SLC array and the MLC array share row addresses and have different column addresses, and wherein data indicated by a start column address of the MLC array is read after data of a final column address of the SLC is read.

7. The non-volatile memory system of claim 2, wherein the SLC array and the MLC array share row addresses and have different column addresses, and wherein data indicated by a start column address of the MLC array is read after data of a final column address of the SLC is read.

* * * * *